United States Patent [19]

Reed

[11] Patent Number: 5,204,836

[45] Date of Patent: Apr. 20, 1993

[54] METHOD AND APPARATUS FOR IMPLEMENTING REDUNDANCY IN PARALLEL MEMORY STRUCTURES

[75] Inventor: John A. Reed, Los Altos, Calif.

[73] Assignee: Sun Microsystems, Inc., Mountain View, Calif.

[21] Appl. No.: 605,510

[22] Filed: Oct. 30, 1990

[51] Int. Cl.$^5$ .............................................. G11C 29/00
[52] U.S. Cl. .................................. 365/200; 365/201; 371/11.1; 371/10.2
[58] Field of Search ............... 365/200, 201; 371/11.1, 371/21.1, 10.2

[56] References Cited

U.S. PATENT DOCUMENTS 4,739,498  4/1988  Eichhorn ............................ 365/200
5,134,584  7/1992  Boler et al. ........................ 365/200

Primary Examiner—Joseph A. Popek
Attorney, Agent, or Firm—Blakely Sokoloff Taylor & Zafman

[57] ABSTRACT

An apparatus and method are disclosed for switching the arrays of parallel memory data structures upon the detection of defects in a memory storage device. To date, redundancy has been implemented using duplicate arrays connected to laser zappable fuses. The use of laser zappable fuses imposes restrictive technology constraints. In particular, to avoid damage to surrounding circuitry when a fuse is "zapped," considerable space must be allowed between each fuse and other fuses or other unrelated circuitry. The present invention uses only two extra parallel arrays to correct for any open or short defects in a parallel memory data structure, and does it with a nearly constant array length as the original arrays. The redundant arrays as well as the original arrays are connected to toggle switches. Upon encountering any open or short in the one or more data paths, the toggle switches coupled to the open or short are "flipped" to connect to the adjacent data paths in a cascading fashion. The toggle switches are implemented as steering logic switches having NMOS and PMOS transistors in a CMOS array. The steering logic switches are controlled with a pointer register which can be implemented either by logically decoding the defect area or by actually implementing a shifter which stops when its state reaches the defect.

44 Claims, 8 Drawing Sheets

METHOD AND APPARATUS FOR IMPLEMENTING REDUNDANCY IN PARALLEL MEMORY STRUCTURES

BACKGROUND OF THE INVENTION

1. Field of the Invention

The present invention relates to a method and apparatus for minimizing the effects of defects in an integrated circuit chip. More specifically, the present invention implements redundancy in highly parallel memory structures.

2. Art Background

It is quite common for a fast central processor unit to feature parallel data paths such as a 32-bit or a 64-bit bus for transferring data into and out of its memory storage. Likewise, most memory storage comprises semiconductor memories organized in rectangular arrays of rows and columns on very-large-scale integrated (VLSI) circuits. The intersection of one row and one column results in a storage element called a "cell". Each cell is capable of storing a binary bit of data. To write data into, and to read data from, a row or column of cells, an address is assigned to each row or column of cells. Access to the address is provided by a binary-coded address presented as input to address decoders that select a row or column for a write or read operation. As semiconductor memories become more and more dense, the arrays of cells become more and more susceptible to the presence of defects which could impede or corrupt the flow of data through any of the desired paths.

Defects in semiconductor memories occur during the fabrication, packaging and field operation of an integrated circuit. Under the rubric of defects, one may include wafer defects, oxide defects, metallization defects, interconnect defects, contamination defects, unintended or missing connections, missing or extra contacts and others. To avoid unnecessarily confusing the presentation of the invention, an "open" defect refers to a defect affecting the data path for one bit of data, while a "short" defect refers to a defect affecting the paths of more than one bit of data.

On-chip redundancy is the construction of redundant elements on an integrated chip to bypass the data paths affected by the defects while preserving the original addresses of the affected data paths. Redundancy is also used to overcome the presence of defects in VLSI circuits such as memory storage. Redundancy is also employed to improve the reliability of computers in sensitive applications (e.g., the backup computers on a space shuttle), or to reduce the down time of the systems (e.g., a redundant computer for monitoring traffic lights). As a result, on-chip redundancy not only improves the yield but also the reliability of integrated circuits.

In the past, on-chip redundancy was implemented with latches or laser zappable fuses located on each column or row of data path. Latches are volatile and require that the information identifying the cells affected by defects be stored external to the semiconductor memory, for example, on a disk, so that when power is turned on, the entire system does not have to be retested for defects.

Laser zappable fuses are physically implemented in CMOS circuits in one of two ways. If the fuse is "normally closed," it is usually made with a polysilicon fuse which can be opened by selective laser zapping. If the fuse is "normally open," it is usually made with a NMOS or a PMOS transistor whose gate voltage is controlled by "normally closed" laser zappable fuses.

The use of latches or laser zappable fuses on each column or row of data path imposes technology constraints. In particular, to avoid damage to surrounding circuitry when a fuse is "zapped," considerable space must be allowed between each fuse and other fuses or other unrelated circuitry. The additional area required for the fuses is generally contradictory with the tight spacing requirements inherent in memory arrays. As applicable to wide-word computing such as the popular use of 32-bit or 64-bit data paths, a number of additional problems arise. A single redundant set of arrays cannot compensate for a short defect between arrays belonging to two adjacent sets. Therefore, at least two sets would be needed to correct such defects. Additionally, data transmissions along the redundant path can suffer a speed penalty due to the extra line length and the incidence of higher parasitic capacitance. In some instances, the input and output data path may be tripled in length for a wide-word computing device. Variable delays from data paths are highly undersirable in high-performance memory storage, as they force the performance of an entire memory array to be no better than that of the extended length path's performance. In addition, laser zappable fuses are irreversible, i.e. once a fuse is blown, it cannot be changed. Finally, fuses must be laid out integrally to each set so as to be able to selectively disconnect sets in which defects exist. (See, "A 50 ns 16 Mb DRAM with a 10 ns Data Rate", Digest of Technical Papers, IEEE International Solid-State Circuits Conference, February 1990, pp 232–233.)

SUMMARY OF THE INVENTION

It is therefore an object of the present invention to implement on-chip redundancy to circumvent any open and short defect in or between arrays in a parallel data structure.

It is a further object of the present invention to implement on-chip redundancy such that all redundant array lengths are as nearly equal to that of original arrays.

It is a further object of the present invention to implement on-chip redundancy in highly parallel data structures to minimize the number of fuses.

It is a further object of the present invention to implement a programmable redundancy in highly parallel memory data structures.

An apparatus and method are disclosed for switching the arrays of parallel data paths are memory data structures upon the detection of defects in the data path or memory storage device. To date, redundancy has been implemented using duplicate arrays connected to laser zappable fuses. The use of laser zappable fuses imposes restrictive technology constraints. In particular, to avoid damage to surrounding circuitry when a fuse is "zapped," considerable space must be allowed between each fuse and other fuses or other unrelated circuitry. The present invention uses only two extra parallel arrays to correct for any open or short defects in a parallel memory data structure, and does it with a nearly constant array length as the original arrays. The redundant arrays as well as the original arrays are connected to toggle switches. Upon encountering any open or short in the one or more data paths, the toggle switches coupled to the data paths affected by the open or short are "flipped" to connect to the adjacent data paths in a cascading fashion. The toggle switches are implemented with NMOS or PMOS transistors in a CMOS array. It follows that the present invention obviates having a latch or laser zappable fuse on each column or row of data path. The toggle switches are controlled with a pointer register which can be implemented either by logically decoding the defect area or by actually implementing a shifter which stops when its state reaches the defect.

BRIEF DESCRIPTION OF THE DRAWINGS

The objects, features, and advantages of the method and apparatus of the present invention will be apparent from the following detailed description of the invention in which.

DETAILED DESCRIPTION OF THE INVENTION

An apparatus and method is disclosed for implementing redundancy in a highly parallel data paths or data structure. In the preferred embodiment, an apparatus and method is disclosed for implementing redundancy in a highly parallel memory data structure. In the following description, for the purposes of explanation, specific devices, signals and data structures are disclosed in order to more thoroughly understand the present invention. However, it will be apparent to one skilled in the art that the present invention may be practiced without these specific details. In other instances, well-known circuits, devices and data structures are not disclosed herein to avoid obscuring the present invention unnecessarily.

Figure 1:
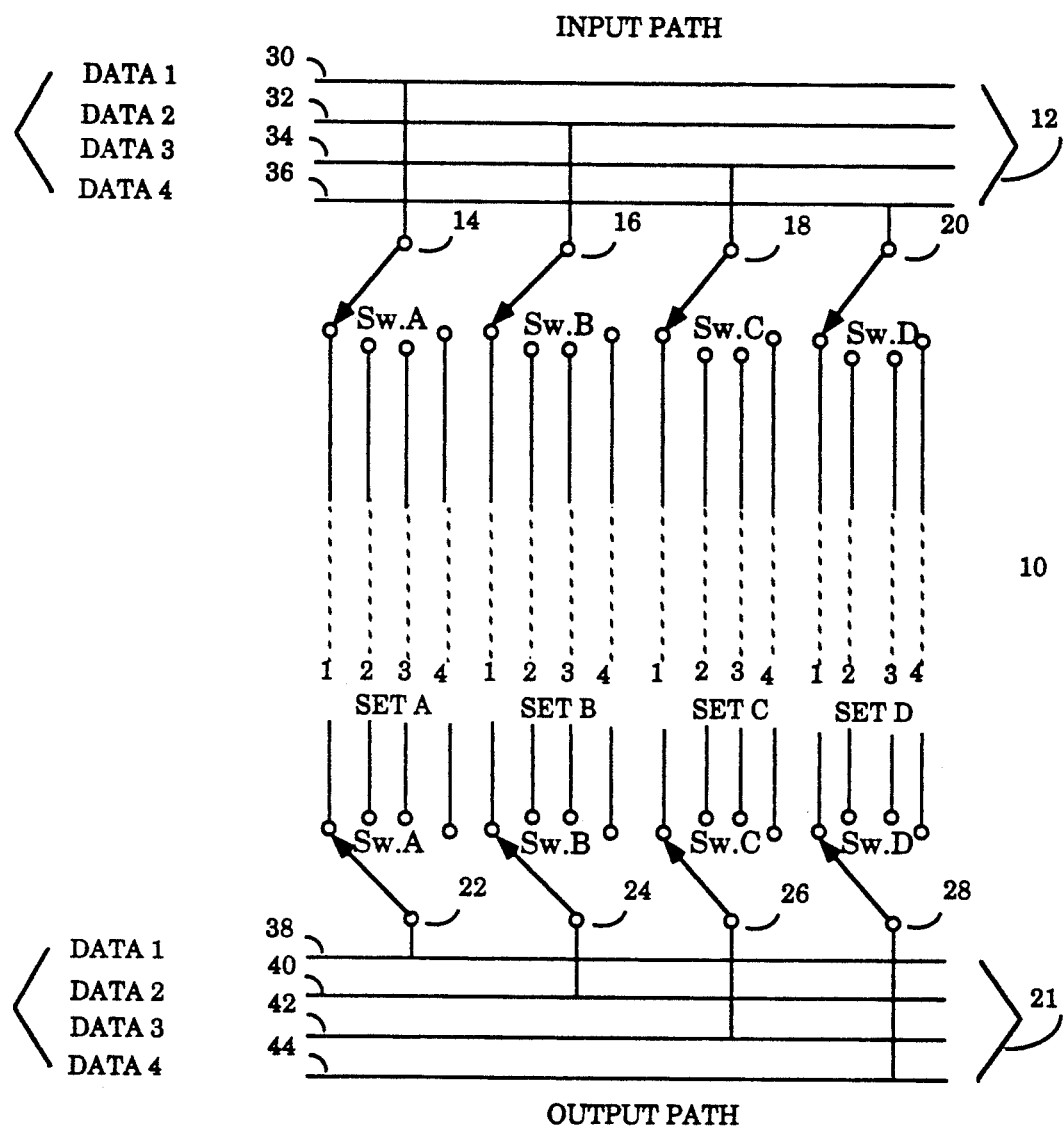
FIG. 1 illustrates a conceptual block diagram of a four-bit wide data path and its connection to a "four-column" set array memory structure.

FIG. 1 shows a pair of four-bit wide data paths 12 and 21 being connected to a parallel memory structure 10. The use of four-bit data paths in this instance is for illustration purpose only. It should be understood that other wide-word data paths may be used to transfer data into and out of the parallel memory structure 10. The parallel memory structure 10 shows a simple "four-column" set of arrays comprising A, B, C, and D. This simple configuration is employed to illustrate the principle and operation of the present invention. It should be understood by one skilled in the art that the present invention is equally applicable to larger memory arrays. Further, the use of column arrays in the parallel memory structure is similarly applicable to row arrays in any semiconductor memory.

The parallel memory structure 10 is connected to the input data path 12 via switches 14, 16, 18 and 20, respectively. The parallel memory structure 10 is further connected to the output data path 21 via switches 22, 24, 26 and 28, respectively. A line 30 of the input data path 12 is shown connected to a line 38 of the output data path 21, via the switch 14 and the switch 22, respectively. A line 32 of the input data path 12 is shown connected to a line 40 of the output data path 21 via the switch 16 and the switch 24. Similarly, a line 34 of the data path 12 is also shown connected with a line 42 of the data path 21 via the switch 18 and 26. Finally, a line 36 of the input data path 12 is connected to a line 44 of the output data path 21 via the switch 20 and 28. The foregoing connections allow data to be written into the parallel memory structure 10 by the input data path 12 and also read by the output data path 21 from the parallel memory structure 10.

Figure 2:
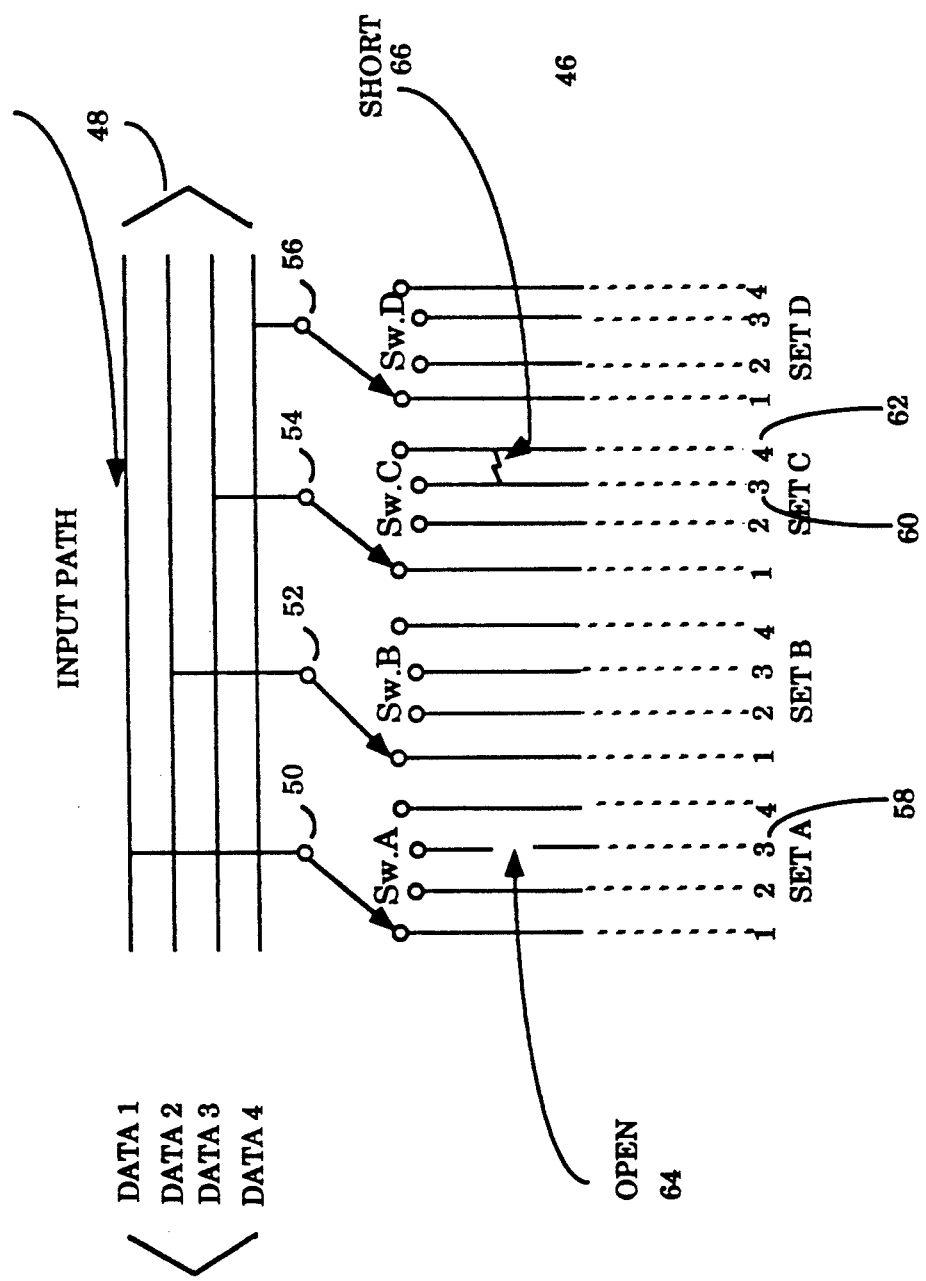
FIG. 2 illustrates a partial view of a parallel memory structure with an open defect and a short defect.

In FIG. 2, a partial view of a parallel memory 46 is shown connected to an input data path 48 via switches 50, 52, 54 and 56 respectively. It should be noted that the parallel memory storage 46, data path 48 and the switches 50, 52, 54 and 56 represent the equivalent upper portions of FIG. 1. An open defect 64 is shown causing a disconnection of an array 58 of the parallel memory structure 46. An open defect refers to a defect affecting one array of a semiconductor memory. A short defect 66 is shown causing a break of an array 60 and an array 62, respectively. A short defect refers to a defect affecting more than one array of a semiconductor memory. Any attempt to channel data from the data path 48 into the array 58 will result in device failure because of the opening defect 64. Similarly, an attempt to transfer data from the data path 48 into either the array 60 or 62 will result in error because of the short defect 66.

Figure 3:
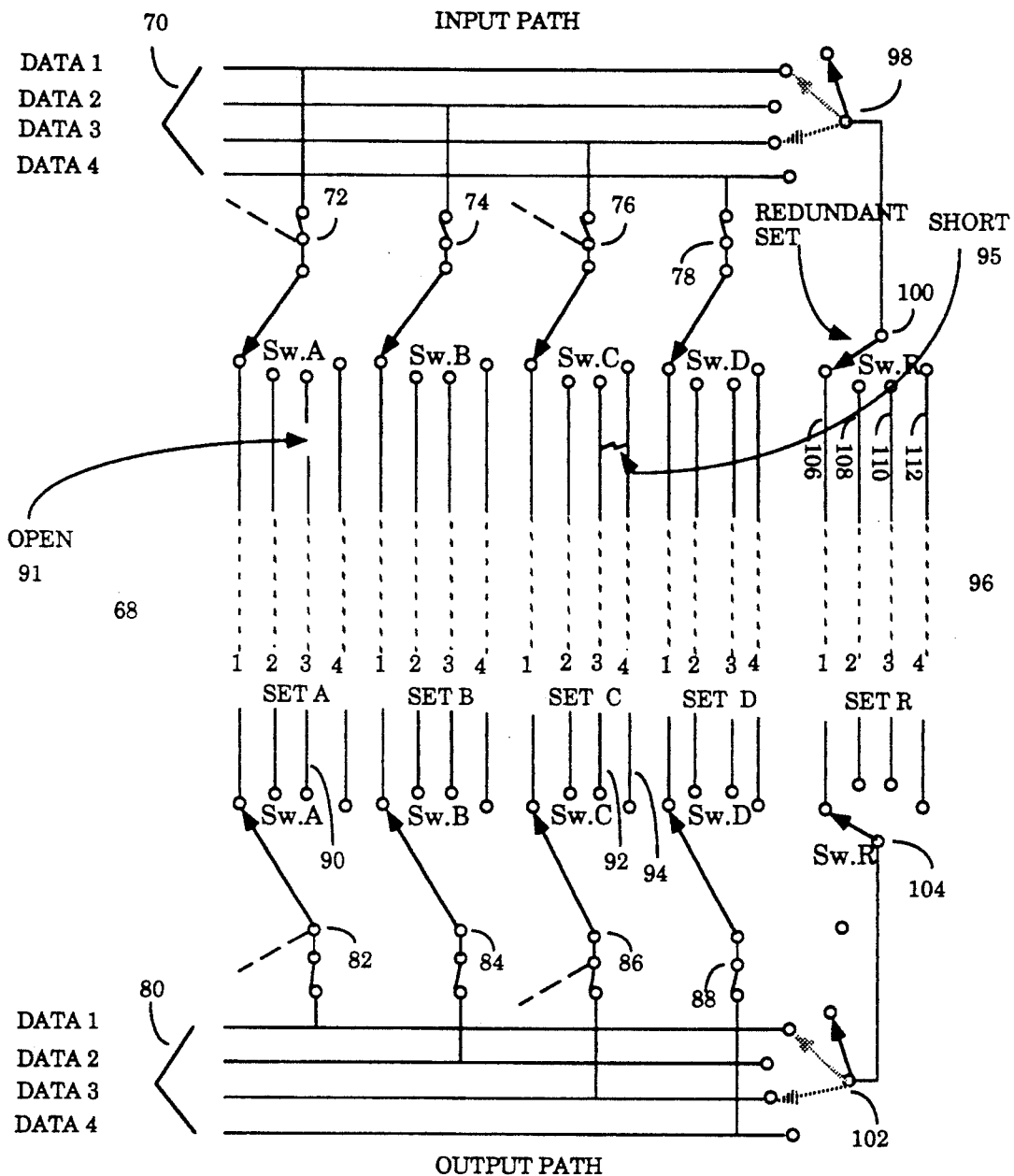
FIG. 3 illustrates a prior art redundancy method implemented in highly parallel memory structures.

FIG. 3 illustrates a prior art redundancy method implemented in highly parallel memory structures. A parallel memory structure 68 is shown connected to an input data path 70 via switches 72, 74, 76 and 78. The parallel memory storage 68 is similarly connected to an output data path 80 via switches 82, 84, 86 and 88. A line 90 is shown with an open defect 91, and a line 92 and 94 of the parallel memory array is shown burdened with a short defect as illustrated in 95. It should be understood that the parallel memory storage and the input data path and output data path in FIG. 3 is identical to the conceptual block diagram in FIG. 2. In the prior art, a redundant set of parallel arrays 96 is included with the parallel memory structure 68. The redundant set of arrays comprise spare arrays 106, 108, 110 and 112. The redundant set of arrays is connected to the input data path 70 via a switch 98 and via switch 100. Similarly, the redundant set of arrays 96 is connected to the output data path 80 via switches 102 and 104. If the parallel memory structure 68 has no defect, all data passes from the input data path 70 through the parallel memory storage 68 and through the output data path 80, and the redundant set 96 is idle. Upon discovery of the open defect 91 and the short defect 95 by testing methods known in the art, one repairs the open defect in 91 by disconnecting the switches 72 and 82 and diverting data into the redundant set 96, while the corresponding switches 98, 100, 102 and 104 re-divert data properly to the output data path 80 as shown by the dashed switches above and below the short. To bypass the short defect 95 affecting the lines 92 and 94 of the parallel memory structure 68, redundant arrays 96 are used again to bypass the short defect found there. As such, data is inputted through switch 98 and 100 through the redundant arrays and similarly outputted through the output data path 80 via the switches 102 and 104.

The switches 72, 74, 76, 78, 82, 84, 86, 88, 98 and 102 in FIG. 3 are physically implemented in CMOS circuits in one of two ways depending upon their nature: (1) if the switch is normally closed, it is usually made with a polysilicon fuse which can be "opened" by selective laser zapping; (2) if the switch is normally open, it is usually made with a NMOS or a PMOS transistor whose gate voltage is controlled by normally closed laser zappable fuses. Laser zappable fuses impose technical constraints on the design and implementation of highly parallel memory structures. In particular, to avoid damage to surrounding circuitry when a fuse is zapped, considerable space must be allowed between each fuse and other fuses or other unrelated circuitry. Redundancies could have been added to the parallel memory storage in FIG. 3 by including a fuse in each column. However, the additional area required for the fuse would generally be incompatible with the tight spacing requirement inherent in memory columns.

The redundant set of arrays that is illustrated in FIG. 3 is a reasonable approach for repairing highly parallel memory arrays which have a relatively narrow data path such as the four-column array shown. Using the redundant set, any combination of defects within any set can be tolerated via simple substitution. However, a number of problems arise for large wide-word arrays such as the increasingly popular 32-bit and 64-bit arrays. A single redundant set cannot compensate for shorts between lines belonging to two adjacent sets. Therefore, two sets would be needed to correct such defects. For a four-line set, 8 redundant lines would be required. Moreover, data transmission along the redundant path can suffer a speed penalty due to the extra line length and the incidence of higher parasitic capacitance. A typical path length under the redundant set may triple for a wide-word device. Variable delays in the data paths are highly undesirable in high performance memory elements as they force the performance of an entire array to be no better than that of the extended length path's performance. Finally, fuses must be laid out integrally to each set so as to be able to selectively disconnect sets in which defects exist.

Figure 4:
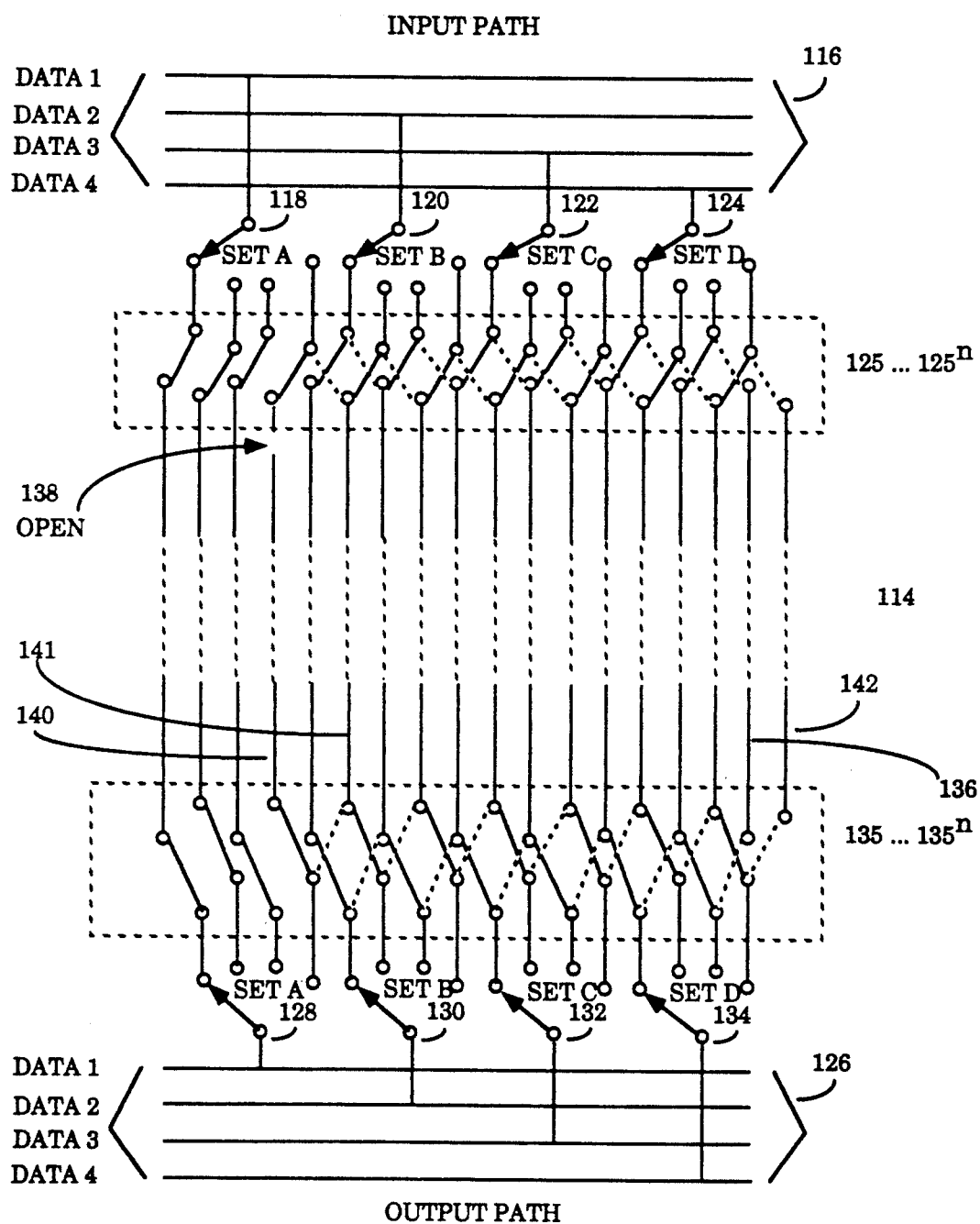
FIG. 4 illustrates a conceptual block diagram of the preferred embodiment of the present invention with an open defect.

FIG. 4 is a conceptual block diagram illustrating the preferred embodiment of the present invention. A parallel memory structure 114, along with two extra arrays 136 and 142, is illustrated. Although the individual memory arrays of memory structure 114 are represented as single lines, it is well known in the art, that a single memory array may also be comprised of two or more lines; the single lines are used to simplify understanding of the invention. The parallel memory structure 114 is connected to an input data path 116 via switches 118, 120, 122 and 124, respectively. The parallel memory structure 114 is further connected to an output data path 126 via toggle switches 128, 130, 132 and 134, respectively. Each array of the parallel memory structure 114 is further connected with a plurality of pairs of redundancy switches 125 through $125^n$ at both ends, including the extra arrays 136 and 142.

Referring again to FIG. 4, an open defect 138 is shown present in an array 140. The preferred embodiment of the present invention repairs the open defect 138 by flipping on the redundancy switches 125 through $125^n$ and 135 through $135^n$, starting at the array 140 and every switch to the right of the defect as shown by the dashed switches. Note that the redundancy switches are set to "jump" two arrays. This is not necessary for correcting a single column defect such as that of FIG. 4, but is necessary for correcting defects affecting two adjacent columns, as will be shown in FIG. 5.

Figure 5:
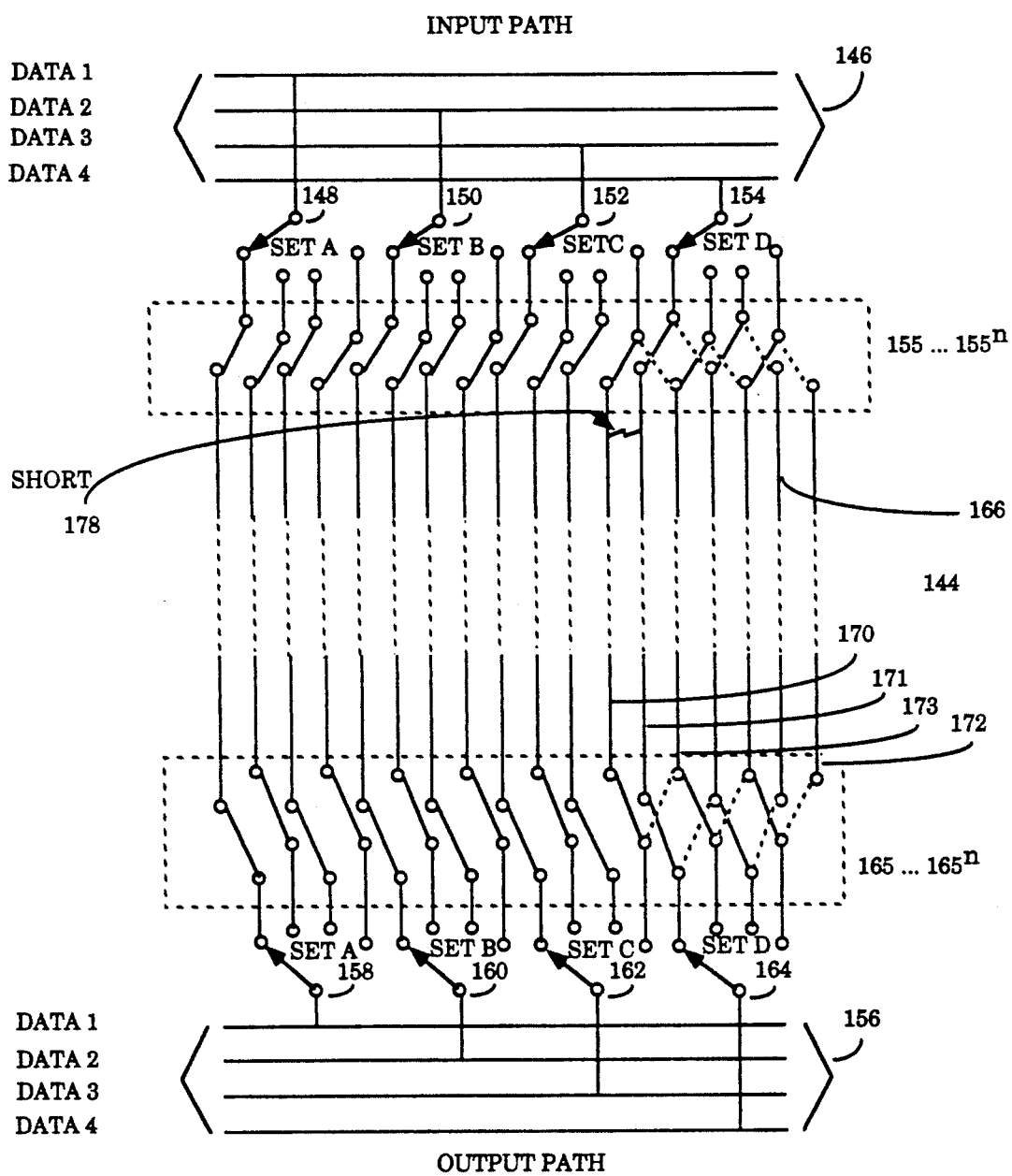
FIG. 5 illustrates a conceptual block diagram of the preferred embodiment of the present invention featuring a short defect.

FIG. 5 is a conceptual block diagram illustrating the preferred embodiment of the present invention. A parallel memory storage 144, along with two spare arrays 166 and 172, is illustrated. The parallel memory 144 is connected to an input path 146 via toggle switches 148, 150, 152 and 154, respectively. The parallel memory structure 144 is further connected to an output data path 156 via toggle switches 158, 160, 162 and 164, respectively. Each array of the parallel memory structure 144 is further connected with a plurality of pairs of redundancy switches, 155 through $155^n$ and 165 through $165^n$, including the spare arrays 166 and 172. In FIG. 4, should the memory arrays of the parallel memory structure 114 each consist of two or more lines, then the number of lines in the input path 116, the number of switches in sets 125 . . . $125^n$ and 135 . . . $135^n$, and number of lines in output path 126 would correspondingly increase.

Referring again to FIG. 5, a short defect 178 is shown present, affecting arrays 170 and 171. In the preferred embodiment of the present invention the short defect 178 is bypassed by flipping the redundancy switches 155 through $155^n$ and 165 through $165^n$ starting with the switches connected on the array 170. Every toggle switch to the right of the array 170 is flipped as shown by the dashed switches. Note that the redundancy switches are set to "jump" two arrays. This is necessary for bypassing the short defect 178.

PREFERRED EMBODIMENT HARDWARE

Figure 6:
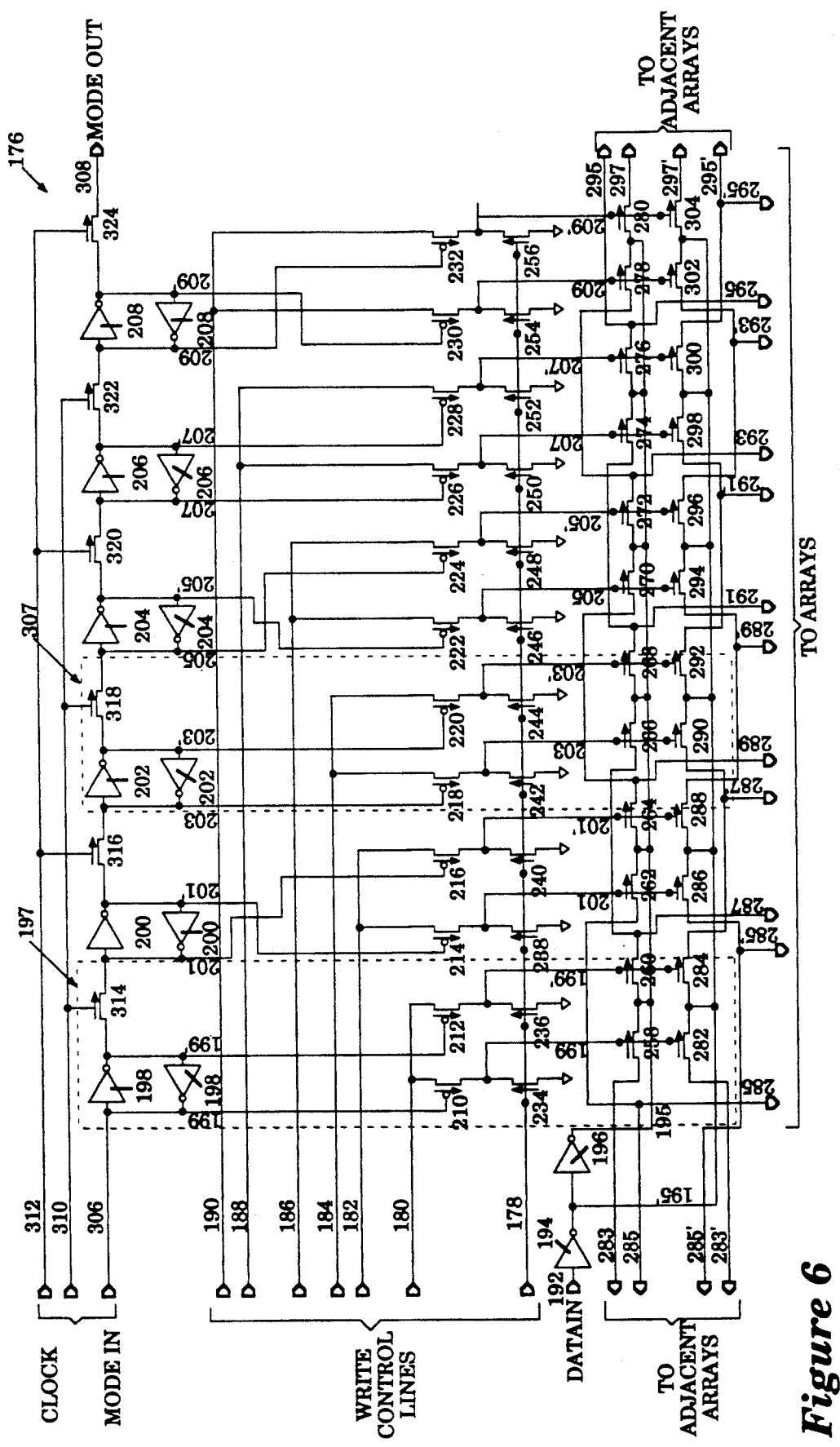
FIG. 6 illustrates a redundancy circuit employing the preferred embodiment of the present invention.

FIG. 6 is a redundancy circuit illustrating the preferred embodiment of the present invention. Shown there is a redundancy circuit 176 having control and data lines coupled at its inputs to a plurality of semiconductor switches for bypassing any short or open defect present in the arrays of a memory structure. In the preferred embodiment of the present invention, the redundancy circuit 176 is coupled at its outputs to an instruction cache of a SPARC ™ processor (SPARC is a trademark of Sun Microsystems, Inc.). The arrays (not shown in FIG. 6) of the instruction cache are static RAMs and configured as a block of six double-rail columns. It should be understood by one skilled in the art that the type, partition and size of the memory arrays coupled to the redundancy circuit 176 are merely design choices and should not serve as limitations on the present invention.

Referring again to FIG. 6, the redundancy circuit 176 comprises six identical steering logic switches, the representative of which are switches 197 and 307. In the preferred embodiment of the present invention, the redundancy circuit is coupled to an instruction cache having a plurality of fields, within each of which are 128 memory columns or arrays. As such, 128 steering logic switches are required to implement the redundancy scheme of the present invention. The steering logic switch 197 further includes a status switch 198, a pair of address switches 210 and 212 coupled to a corresponding pair of grounding switches 234 and 236, two pairs of data switches 258, 260, 282 and 284, and a propagating switch 314. Preferably, the status switch is a pair of inverted inverters, the address switches are a pair of PMOS transistors, the grounding switches are a pair of NMOS transistors, the data switches are two pairs of NMOS transistors, and the propagating switch is a NMOS transistor. The six steering logic switches are cascade-connected at the portions having the status switches and the propagating switches. In other words, the propagating switch 314 is coupled to the status switch 200 which is coupled to the propagating switch 316 which is in turn coupled to the status switch 202 and so on. The six steering logic switches are also interlace-connected at the portions having the data switches. In other words, the data switches of the steering logic switches are interconnected every other M arrays, where M is the number of redundant arrays and M=2 in the preferred embodiment of the present invention. The significance of how the steering logic switches are connected shall be elaborated in the section describing the operation of the preferred embodiment of the present invention.

In FIG. 6, the redundancy circuit 176 is coupled at its inputs to six write control lines 180-190 and a data line 192 for receiving addresses and data, respectively, from a processor. The lines 180-192 correspond to the input path 116 in FIG. 4 and input path 146 in FIG. 5. In the preferred embodiment of the present invention, the lines 180-192 are coupled to an execution unit in a SPARC processor for receiving instructions, data and addresses therefrom. Each of the six write control lines 180-190 is coupled in parallel to a pair of address switches of one of the six steering logic switches. The seventh write control line 178 is tied commonly to all the grounding switches 234-256 of the steering logic switches for rosetting purposes. At the same time, the data input line 192 provides two complimentary data input signals 195 and 195' over two inverters 194 and 196 to the redundancy circuit 176. The data input signals 195 and 195' are further coupled to the data switches 258-280 and 282-304, respectively, for transferring data information to the arrays coupled to the redundancy circuit 176.

The redundancy circuit 176 is further coupled at its inputs to a steering mode line 306, and clock lines 310 and 312 for receiving a plurality of control signals therefrom. In the preferred embodiment of the present invention, the steering mode line 306 and the clock lines 310 and 312 are coupled to a controller (described in FIG. 7) for registering the location of defective columns or arrays coupled to the redundancy circuit. The steering mode line 306 and the clock lines 310 and 312 are coupled to the inputs of the steering logic switches having the status switches and the propagating switches. Referring again to FIG. 6, the steering mode line 306 is coupled to the input of the status switch 198 which is coupled to the propagating switch 314. As mentioned earlier, the status and propagating switches of the steering logic switches are cascade-connected. The output of the propagating switch 324 thus becomes the steering mode line 308 to be coupled to the input of the status switch of an adjacent redundancy circuit (not shown in FIG. 6). The clock lines 310 and 312 are interlace-connected with the propagating switches 314-324 for shifting wave or code information from one steering logic switch to the next. It should be understood by one skilled in the art that the steering mode line 306 and 308, clock lines 310 and 312, status switches 198-200 and propagating switches 314-324 and the controller 330 (described in FIG. 7) constitute a pointer register for implementing redundancy with the address switches 210-232 and data switches 258-304. The features of the pointer register shall be elaborated in conjunction with the section on the operation of the redundancy circuit 176. The pointer register of the present invention may, for instance, be implemented with a address decoder.

With respect to the steering logic switch 197, the write control line 180 is coupled to the source of address switches 210 and 212 for asserting a write control signal when the processor is ready to write data onto the array with the same address as the array coupled to the steering logic switch 197. The drain of each of the address switches 210 and 212 is coupled to the drain of two grounding switches 234-236 whose gate is commonly tied with the write control line 178. Meanwhile, the drain of the address switches 210 and 212 are coupled to the gate of two pairs of data switches 258, 260, 282 and 284. As mentioned in the preceding paragraph, the data switches 258 and 260 are interlace-connected with the data switches 266 and 268 as well as the corresponding pairs of data switches of every other steering switches. It should be understood by one skilled in the art that the address switches 210-232 and data switches 258-304 correspond to the toggle switches 125 ... 125$^n$ or 135 ... 135$^n$ in FIG. 4 and the toggle switches 155 ... 155$^n$ or 165 ... 165$^n$ in FIG. 5. Referring again to FIG. 6, the gates of the address switches 210 and 212 are coupled to the status switch 198. The status switch 198 has its input coupled to the steering mode line 306; moreover, the output of the status switch 198 is coupled to the propagating switch 314.

In FIG. 6, the redundancy circuit 176 is further coupled at its outputs to the arrays of a memory structure over the output lines 283-297 and 283'-297' (odd numerals). Although the arrays coupled to the redundancy circuit 176 have six double-rail data columns (connected to lines 285-295, 285'-295'), the total number of pairs of outputs from the redundancy circuit 176 is ten. The four extra outputs are for connecting adjacent arrays blocks of a larger memory structure. In the preferred embodiment of the present invention, no particular outputs lines 283-297 and 283'-297' are designated as the redundant arrays because they may be located anywhere in the arrays. For instance, the redundant arrays may be put on each side of the memory structure or in the middle. It should be understood by one skilled in the art that the number of redundant arrays is a design choice. Thus, if the user determines that defects are likely to occur in three adjacent arrays in a memory structure, three redundant arrays can be implemented in a straight forward manner without departing from the scope of the present invention. The redundancy circuit 176 has a steering mode output line 308 for inter-connecting the redundancy circuits of the adjacent array block.

OPERATION

It is common in the semiconductor industry to conduct a variety of tests, including checking for defects in the memory arrays, before data is transferred into and out of memory systems. In one prior art method, a computer system would self-test its memory upon every power-up sequence. When defective memory arrays are detected, software in the power-on sequence would determine if the defective array can be bypassed or repaired within the parameters of the redundancy scheme. Assuming the defective arrays can be repaired or bypassed, the alternative routing would be stored in the register such that the transfer of data into and out of the memory system may be diverted to non-defective memory arrays. Under this prior art method the redundancy testing scheme of the power-on sequence is repeated whenever the computer system undergoes another power-on sequence.

An alternative method of implementing redundancy in highly parallel memory structures is to test the integrity of the memory array as the memory comes off the wafer. Testing equipment known in the art would probe the individual memory array algorithmically and from their failure pattern would determine whether or not a particular redundancy scheme can be successfully applied to bypass the defective memory arrays. Assuming the failure pattern falls within the parameters of a redundancy scheme, the location of the defective memory array would be affixed to the manufacturer's die subsequently by actually blowing some fuses. In the preferred embodiment of the present invention, this alternative method of implementing redundancy is adopted to improve the yield of fabricating high speed microprocessor chips having on-chip caches.

Figure 7:
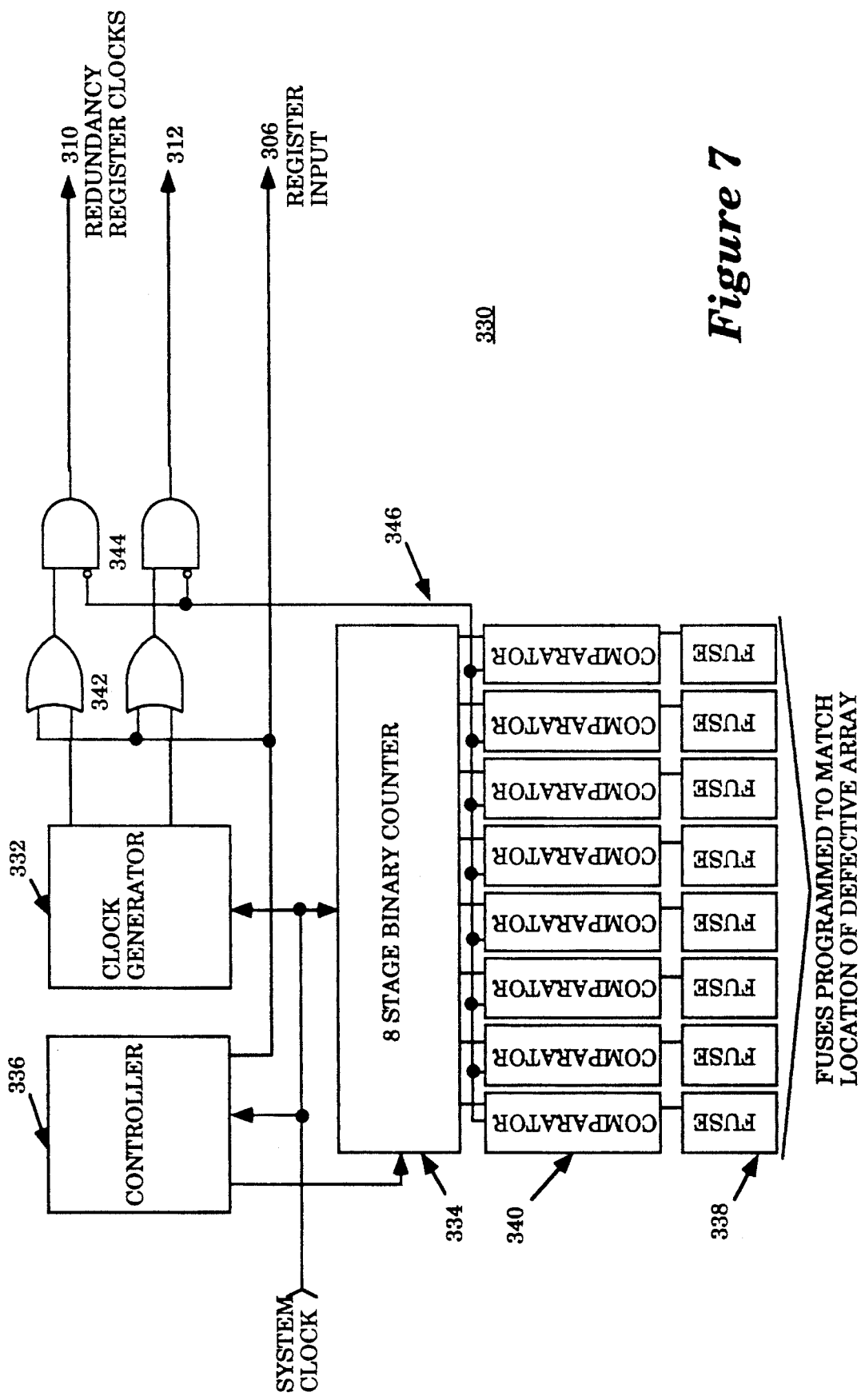
FIG. 7 illustrates a controller used in conjunction with the redundancy circuit of the present invention.

FIG. 7 is a circuit diagram of a controller block used in the preferred embodiment of the present invention for registering the location of defective memory arrays detected during the manufacturing testing of the wafer. The controller block 330 comprising a clock generator 332, a controller 336, at least one polysilicon fuse 338, at least one comparator 340, OR-gates 342, and NOT-AND gates 344. The outputs of the clock generator 332 are coupled to OR gates 342, the outputs of which are coupled to NOT-AND gates 344, the outputs of NOT-AND gates 344 are the redundancy register clocks 310 and 312, respectively. The system clock, besides providing the reference frequency for the clock generator 332, is coupled to controller 336 to insure that the controller unit is synchronized to the system, and is further coupled to the 8-stage binary counter 334. Comparators 340 are arranged so as to compare the current count of binary counter 334 with the programmed state of fuses 338. Whenever this comparison becomes valid, the common comparator output line 346, coupled to the inverted (NOT) inputs of gates 344, serves to block subsequent clock pulses which would otherwise be generated thereby.

The following discussion provides an example on how the controller block 330 is used to repair defective array instances in any one of 132 array elements in a block-oriented memory structure. Because there are 132 array elements, the number of stages required by binary counter 334 and by fuse block 338 are eight. As is known in the art, the number of counter/fuse stages N must be sufficient to contain enough states to include any possible combination of array elements to be repaired from the set of 132.

Upon manufacturing each memory array to be potentially repaired with this technique, each such array is first tested to determine if such repairs are appropriate, i.e., if there are faults, and if the faults are restricted to either a single array or to a short between two adjacent arrays.

Once it is determined that the faults are appropriately repairable (the alternative is to discard arrays in which faults are not repairable), the location of the faulty array or arrays is therefore known and the binary number corresponding to the fault location is programmed into fuses 338 by blowing or zapping the appropriate fuses.

Figure 8B:
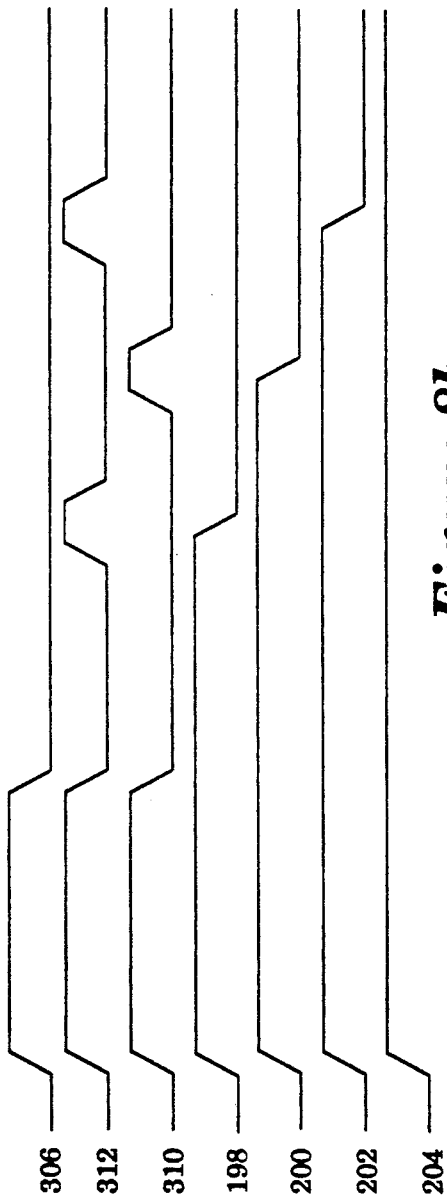
FIG. 8b is a timing diagram of the steering logic implemented by the redundancy circuit of the preferred embodiment of the present invention.
Figure 8A:
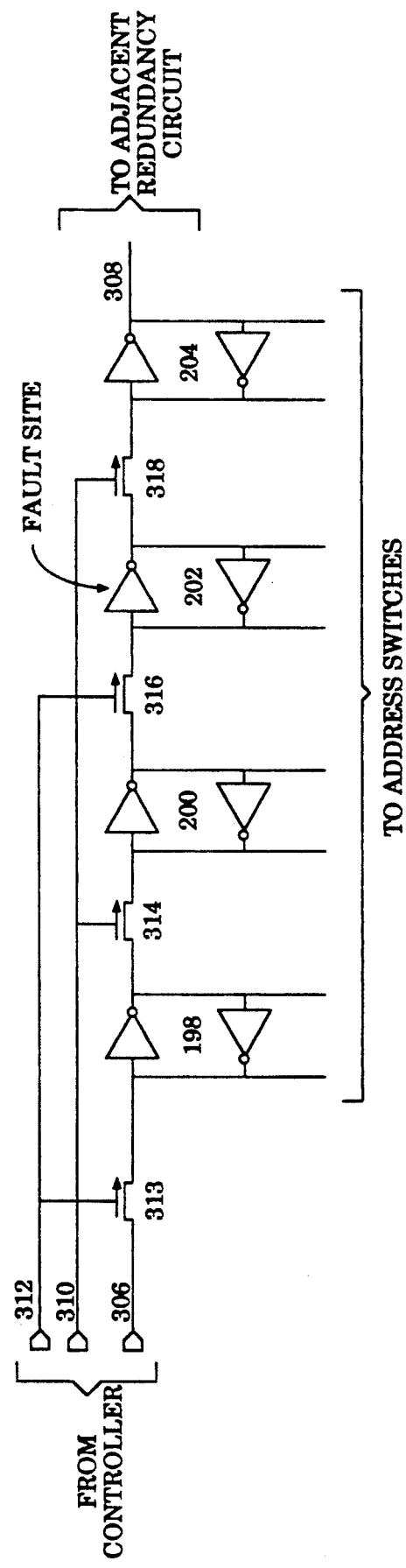
FIG. 8a illustrates a partial view of the redundancy circuit showing the location of a defective memory column.

FIG. 8a shows a small but representative portion of the more complex FIG. 6, and FIG. 8b shows representative timing waveforms which would be generated by the controller block 330 of FIG. 7 to repair a typical fault.

In the Example chosen to illustrate the procedure, the fault site is at switch 202 of FIG. 8a.

To properly mark and point to the fault site of switch 202, which is the 3rd array in the group of arrays, the binary state "00000010" (the binary equivalent of decimal "2") is blown or zapped into the fuses 338 (the counter's least significant bit to the right of the numeric expression).

Initially, all register elements 198, 200, 202, 204, etc., are forced into a known state by the action of register input line 306, which forces both clock lines to a logical ONE state (due to OR gate 342), while simultaneously supplying the same condition to register input 306. After line 306, controlled by controller 336, falls to its normal logical ZERO state, indicated by the falling edge of line 306 in timing diagram FIG. 8b, so also do redundancy register clock signals 310 and 312.

Following the fall of line 306, clock generator 332, designed to emit two interleaved clocks, one for each cycle of the system clock, continues to issue its outputs to OR gates 342, whose outputs, coupled to AND gates 344, become the redundancy register clocks on lines 310 and 312.

Meanwhile, the controller allows the binary counter 334 to count each cycle of the system clock. Prior to reaching a match (as determined by comparator 340) between the binary counter 334 and the fuses 338, line 346 allows gates 344 to pass the redundancy register clocks 310 and 312.

However, when the binary counter 334 reaches the aforementioned binary state "00000010", as chosen for this example, the line 346 changes state, to a condition which inhibits further redundancy register clocks 310 and 312, through the action of NOT-AND gates 344.

In response to the aforementioned clocking sequence, FIG. 8b shows the resulting states of the address switches 198, 200, 202, and 204. In particular, with each pulse of clocks 312 and 310, these stages successively change state in a ripple fashion. When the counter 334 reaches its condition of matching with the fuse blocks 338, the redundancy register clocks 312 and 310 stop, and the redundancy register switches 198, 200, 202, 204, et al., subsequently retain said state until power is removed from the device.

The action described heretofore shows a scheme wherein in the beginning, all toggle switches (such as switches 125 . . . 125$^n$ and 135 . . . 135$^n$ of FIG. 4) are switched so as to point "to the right", or away from the input to the register. For this embodiment, the two left-most arrays (those nearest the first register stage) would be disconnected in the event of no discovered faults. Any fault detection, and subsequent correction by register programming, as described herein, would result in the use of these arrays.

Thus, the present invention implements a redundancy scheme by bypassing defects detected in memory columns of highly parallel memory structures without having to rely upon latches or lase-zappable fuses being coupled to every memory column or array. The use of status switches such as the ones shown in FIG. 6 and FIG. 8a (which happen to be inverted pairs) not only conserves chip area, but also reduces access time to highly parallel memory structures. As such, the present invention improves yields of highly parallel memory structures in an environment that requires increasing complexity in design and miniaturizations in semiconductor devices.

While the present invention has been particularly described with reference to FIGS. 1-8 and with emphasis on certain memory structures, it should be understood that the figures are for illustration purposes only and should not be taken as limitations upon the present invention. In addition, it is clear that the methods and apparatus of the present invention has utility in any application where redundancy in memory structures are desired. It is contemplated that numerous alternatives, modifications, variations and uses may be made, by one skilled in the art, without departing from the spirit and scope of the invention as disclosed above.

What is claimed is:

1. In a data structure comprising a plurality of arrays, and data paths connected to the data structure for transferring data into and transferring data from said data structure according to a data structure address control signal, a method for bypassing defects detected as present in said arrays of said data structure comprising the steps of:
   adding M spare alternate arrays to said data structure;
   connecting the address control signal and data paths to address switches, said address switches directing the data into and from arrays identified by the address control signal;
   connecting the address switches to data switches, said data switches interleaved with one another such that the data switches may be selectively coupled to an array and an alternate array, said array and alternate array spaced M arrays apart;
   if a defect in an array is detected, changing the state of data switches which are coupled to arrays between and including the defective array and spare alternate arrays to be coupled to alternate arrays thereby diverting data around the defective array.

2. The method as set forth in claim 1 wherein said spare arrays have substantially the same path length as said arrays.

3. The method as set forth in claim 1 wherein said data structure comprises parallel arrays.

4. The method as set forth in claim 1, wherein said data structure comprises memory and said method reads data from said memory and writes data to said memory.

5. The method as set forth in claim 1, wherein M equals 2.

6. In a memory structure comprising a plurality of arrays, and data paths connected to the memory structure for writing data into and reading data from said memory structure according to a memory structure address control signal, a method for bypassing defects detected as present in said arrays of said memory structure comprising the steps of:
   adding M spare alternate arrays to said memory structure;
   connecting the address control signal and data paths to address switches, said address switches directing the data into and from arrays identified by the address control signal;
   connecting the address switches to data switches, said data switches interleaved with one another such that the data switches may be selectively coupled to an array and an alternate array, said array and alternate array spaced M arrays apart;
   if a defect in an array is detected, changing the state of data switches which are coupled to arrays between and including the defective array and spare alternate arrays, to be coupled to alternate arrays thereby diverting data around the defective array.

7. The method as set forth in claim 6 wherein said spare arrays have substantially the same path length as said arrays.

8. The method as set forth in claim 6 wherein said memory structure comprises parallel arrays.

9. In a data structure comprising a plurality of arrays, and data paths connected to the data structure for transferring data into and transferring data from said data structure according to a data structure address control signal, a method for bypassing defects detected by a controller to be present in said arrays of said data structure, said method comprising the steps of:
   connecting the address control signal and data paths to address switches, said address switches directing the data into and from arrays identified by the address control signal;
   connecting the address switches to data switches, said data switches interleaved with one another such that the data switches may be selectively coupled to an array and an alternate array, said array and alternate array spaced M arrays apart;
   providing a status switching means to be connected to each data switch, said status switching means indicating whether arrays are defective;
   connecting the controller to a first status switching means;
   connecting the status switching means through a propagating means whereby a signal received by the first status switching means is propagated through to the remaining status switching means;
   if defects in an array is detected by the controller,
      said controller sending a signal to the first status switching means identifying the location of the defective array,
      propagating the signal to the remaining status switching means through the propagating means,
      changing the state of data switches which are coupled to arrays between and including the defective array and spare arrays, to be coupled to alternate arrays thereby diverting data around the defective array.

10. The method as set forth claim 9, wherein said data structure comprises memory and said method reads data from said memory and writes data to said memory.

11. The method as set forth in claim 9, wherein said spare arrays have substantially the same path length as said arrays.

12. The method as set forth in claim 9, wherein said data structure comprises parallel arrays.

13. The method as set forth in claim 9, wherein M equals 2.

14. In a data structure comprising a plurality of arrays, and data paths connected to the data structure for transferring data into and transferring data from said data structure according to a data structure address control signal, a circuit for bypassing defects detected as present in said arrays of said data structure comprising:
   M spare alternate arrays to be added to said data structure;
   address switches connected to the address control signal and data paths, said address switches directing the data into and from arrays identified by the address control signal;

data switches connected to the address switches, said data switches interleaved with one another such that the data switches may be selectively coupled to an array and an alternate array, said array and alternate array spaced M arrays apart, such that if a defect in an array is detected, the state of data switches which are coupled to arrays between and including the defective array and spare arrays are changed to be coupled to alternate arrays thereby diverting data around the defective array.

15. The circuit as set forth in claim 14 wherein said spare arrays have substantially the same path length as said arrays.

16. The circuit as set forth in Claim 14 wherein said data switches comprises NMOS transistors.

17. The circuit as set forth in claim 14, wherein said address switches comprises PMOS transistors.

18. The circuit as set forth in claim 14 further comprising a pointer register connected to the data switches to identify the location of the defect.

19. The circuit as set forth in claim 14, wherein said data structure comprises parallel arrays.

20. The circuit as set forth in claim 14, wherein M=2.

21. In a memory structure comprising a plurality of memory arrays, and data paths connected to the memory structure of writing data into and writing data from said memory structure according to a memory structure address control signal, a circuit for bypassing defects detected as present in said arrays of said memory structure comprising:

M spare alternate arrays to be added to said data structure;

address switches connected to the address control signal and data paths, said address switches directing the data into and from arrays identified by the address control signal;

data switches connected to the address switches, said data switches interleaved with one another such that the data switches may be selectively coupled to an array and an alternate array, said array and alternate array spaced M arrays apart, such that if a defect in a array is detected, the state of data switches which are coupled to arrays between and including the defective array and spare arrays are changed to be coupled to alternate arrays thereby diverting data around the defective array.

22. The circuit as set forth in claim 21 wherein said spare arrays have substantially the same path length as said arrays.

23. The circuit as set forth in claim 21, wherein said data switches comprises NMOS transistors.

24. The circuit as set forth in claim 21, wherein said address switches comprises PMOS transistors.

25. The circuit as set forth in claim 21 further comprising a pointer register connected to the data switches to identify the location of the defect.

26. The circuit as set forth in claim 21, wherein said memory structure comprises parallel arrays.

27. The circuit as set forth in claim 21, wherein M=2.

28. In a data structure comprising a plurality of arrays, and data paths connected to the data structure for transferring data into and transferring data from said data structure according to a data structure address control signal, a circuit for bypassing defects detected by a controller to be present in said arrays of said data structure, said circuit comprising:

M spare alternate arrays to be added to said data structure;

address switches connected to the address control signal and data paths, said address switches directing the data into and from arrays identified by the address control signal;

data switches connected to the address switches, said data switches interleaved with one another such that the data switches may be selectively coupled to an array and an alternate array, said array and alternate array spaced M arrays apart, status switching means connected to each data switch, said status switching means indicating whether arrays are defective, a first status switching means connected to the controller;

propagating means connected between the status switching means, whereby a signal received by the first status switching means is propagated through to the remaining status switching means;

such that if a defect in an array is detected, a signal is output by the controller to the first status switching means identifying the array containing the defect and the signal is propagated through the status switching means through the propagating means and the state of data switches which are coupled to arrays between and including the defective array and spare arrays are changed to be coupled to alternate arrays thereby diverting data around the defective array.

29. The circuit as set forth in claim 28, wherein said data structure comprises memory and data is read from said memory and written to said memory.

30. The circuit as set forth in claim 28, wherein said spare arrays have substantially the same path length as said arrays.

31. The circuit as set forth in claim 28, wherein said data switches comprise NMOS transistors.

32. The circuit as set forth in claim 28, wherein said address switches comprise PMOS transistors.

33. The circuit as set forth in claim 28, wherein said propagating means comprise NMOS transistors.

34. The circuit as set forth in claim 28, wherein said data structure comprises parallel arrays.

35. The circuit as set forth in claim 28, further comprising a pointer register connected between the controller and the first status switch to decode the signal output by the controller to identify the location of the defect.

36. The circuit as set forth in claim 35, wherein the controller outputs a binary signal identifying the location of the defect and said pointer register comprises a shifter which shifts the binary signal one bit at a time through the status switching means through the propagating means, said shifter stopping its state when the binary data reaches said location of said defect.

37. In a memory structure comprising a plurality of arrays of memory, and data paths connected to the memory structure for writing data into and reading data from said memory structure according to a memory structure address control signal, a circuit for bypassing defects detected by a controller to be present in said arrays of said memory structure, said circuit comprising:

M spare alternate arrays to be added to said memory structure;

address switches connected to the address control signal and data paths, said address switches directing the data into and from arrays identified by the address control signal;

data switches connected to the address switches, said data switches interleaved with one another such that the data switches may be selectively coupled to an array and an alternate array, said array and alternate array spaced M arrays apart, status switching means connected to each data switch, said status switching means indicating whether arrays are defective, a first status switching means connected to the controller;

propagating means connected between the status switching means, whereby a signal received by the first status switching means is propagated through to the remaining status switching means;

such that if a defect in an array is detected, a signal is output by the controller to the first status switching means identifying the array containing the defect and the signal is propagated through the status switching means through the propagating means and the state of data switches which are coupled to arrays between and including the defective array and spare arrays are changed to be coupled to alternate arrays thereby diverting data around the defective array.

38. The circuit as set forth in claim 37, wherein said spare arrays have substantially the same path length as said arrays.

39. The circuit as set forth in claim 37, wherein said data switches comprise NMOS transistors.

40. The circuit as set forth in claim 37, wherein said address switches comprise PMOS transistors.

41. The circuit as set forth in claim 37, wherein said propagating means comprise NMOS transistors.

42. The circuit as set forth in claim 37, wherein said data structure comprises parallel arrays.

43. The circuit as set forth in claim 37, further comprising a pointer register connected between the controller and the first status switch to decode the signal output by the controller to identify the location of the defect.

44. The circuit as set forth in claim 43, wherein the controller outputs a binary signal identifying the location of the defect and said pointer register comprises a shifter which shifts the binary signal one bit at a time through the status switching means through the propagating means, said shifter stopping its state when the binary data reaches said location of said defect.

* * * * *